United States Patent
Onodera (10) Patent No.: US 7,117,406 B2
(45) Date of Patent: Oct. 3, 2006

(54) SEMICONDUCTOR MEMORY DEVICE AND METHOD OF TESTING SAME

(75) Inventor: Takeshi Onodera, Kanagawa (JP)

(73) Assignee: Sony Corporation, Tokyo (JP)

( * ) Notice: Subject to any disclaimer, the term of this patent is extended or adjusted under 35 U.S.C. 154(b) by 364 days.

(21) Appl. No.: 10/390,759

(22) Filed: Mar. 19, 2003

(65) Prior Publication Data

US 2003/0182607 A1   Sep. 25, 2003

(30) Foreign Application Priority Data

Mar. 22, 2002 (JP) ............................ P2002-081694

(51) Int. Cl.
*G11C 29/00* (2006.01)
(52) U.S. Cl. .................. 714/718; 365/200; 365/201
(58) Field of Classification Search .................. 714/719
See application file for complete search history.

(56) References Cited

U.S. PATENT DOCUMENTS

| 5,457,696 | A | * | 10/1995 | Mori ........................... 714/720 |
| 5,537,631 | A | * | 7/1996 | Wong et al. .................... 714/7 |
| 5,883,843 | A | * | 3/1999 | Hii et al. ..................... 365/201 |
| 6,536,003 | B1 | * | 3/2003 | Gaziello et al. ............ 714/710 |
| 6,694,461 | B1 | * | 2/2004 | Treuer ......................... 714/719 |

* cited by examiner

*Primary Examiner*—Albert Decady
*Assistant Examiner*—Steve Nguyen
(74) *Attorney, Agent, or Firm*—Rader, Fishman & Grauer, PLLC; Ronald P. Kananen (57) ABSTRACT

A semiconductor memory device is provided which includes: a plurality of memory cells each formed by latch means; gated clock circuits for writing identical data to all of the memory cells in response to a simultaneous writing signal supplied thereto; inverters for inverting data outputted from the memory cells; and selectors for selectively writing the inverted data to the memory cells.

3 Claims, 12 Drawing Sheets

PRIOR ART

SEMICONDUCTOR MEMORY DEVICE AND METHOD OF TESTING SAME

BACKGROUND OF THE INVENTION

The present invention relates to a semiconductor memory device and a method of testing the same.

In a small-scale memory embedded in a chip, a latch type memory (hereinafter also referred to as a "register file") using latch circuits as memory elements is used for lower power consumption instead of a common RAM (Random Access Memory). The register file can reduce power consumption by about 70% as compared with the RAM.

Figure 8:
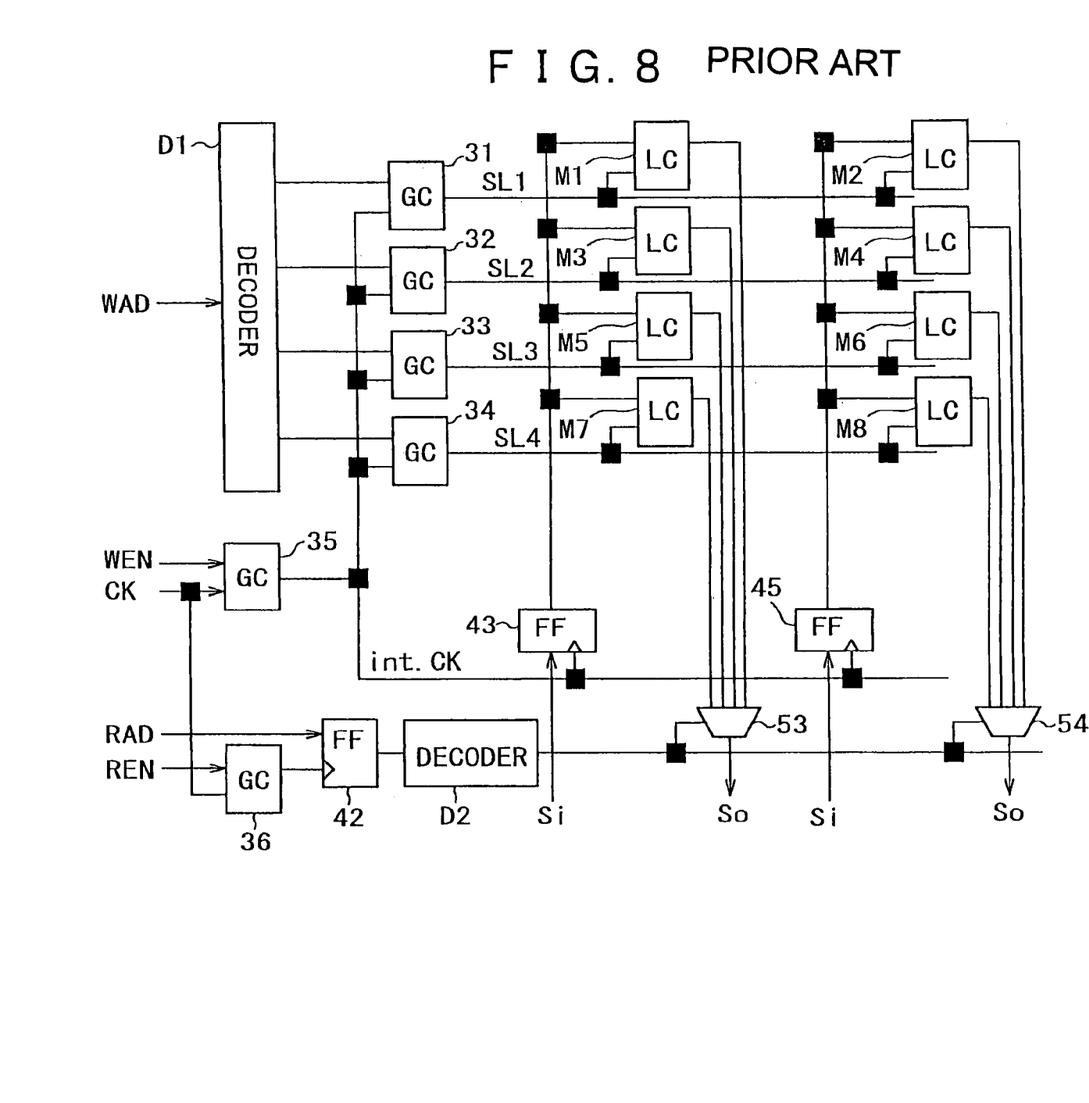
FIG. 8 is a block diagram showing a configuration of a conventional register file.

FIG. 8 is a block diagram showing a configuration of a conventional register file. As shown in FIG. 8, the conventional register file includes latch type memory cells (LC) M1 to M8, gated clock circuits (GC) 31 to 36, flip-flops (FF) 42, 43, and 45, selectors 53 and 54, and decoders D1 and D2.

The gated clock circuits 31 to 34 are connected to the decoder D1 and the gated clock circuit 35. The gated clock circuit 35 is supplied with a clock signal CK and a write enable signal WEN for allowing data to be written to the latch type memory cells M1 to M8.

The gated clock circuit 36 is supplied with the clock signal CK and a read enable signal REN for allowing data to be read from the latch type memory cells M1 to M8. A data input node of the flip-flop 42 is supplied with a reading address RAD, and a clock input node of the flip-flop 42 is connected to the gated clock circuit 36. The decoder D2 is connected to the flip-flop 42.

Clock input nodes of the flip-flop 43 and the flip-flop 45 are connected to the gated clock circuit 35, and data input nodes of the flip-flop 43 and the flip-flop 45 are supplied with input data Si. Data input nodes of the latch type memory cells M1, M3, M5, and M7 are connected to an output node of the flip-flop 43. Data input nodes of the latch type memory cells M2, M4, M6, and M8 are connected to an output node of the flip-flop 45.

Clock input nodes of the latch type memory cells M1 and M2 are both connected to the gated clock circuit 31; clock input nodes of the latch type memory cells M3 and M4 are both connected to the gated clock circuit 32; clock input nodes of the latch type memory cells M5 and M6 are both connected to the gated clock circuit 33; and clock input nodes of the latch type memory cells M7 and M8 are both connected to the gated clock circuit 34.

An input node of the selector 53 is connected to output nodes of the latch type memory cells M1, M3, M5, and M7, and a select signal input node of the selector 53 is connected to the decoder D2. An input node of the selector 54 is connected to output nodes of the latch type memory cells M2, M4, M6, and M8, and a select signal input node of the selector 54 is connected to the decoder D2. The selector 53 and the selector 54 output output data So.

Figure 9:
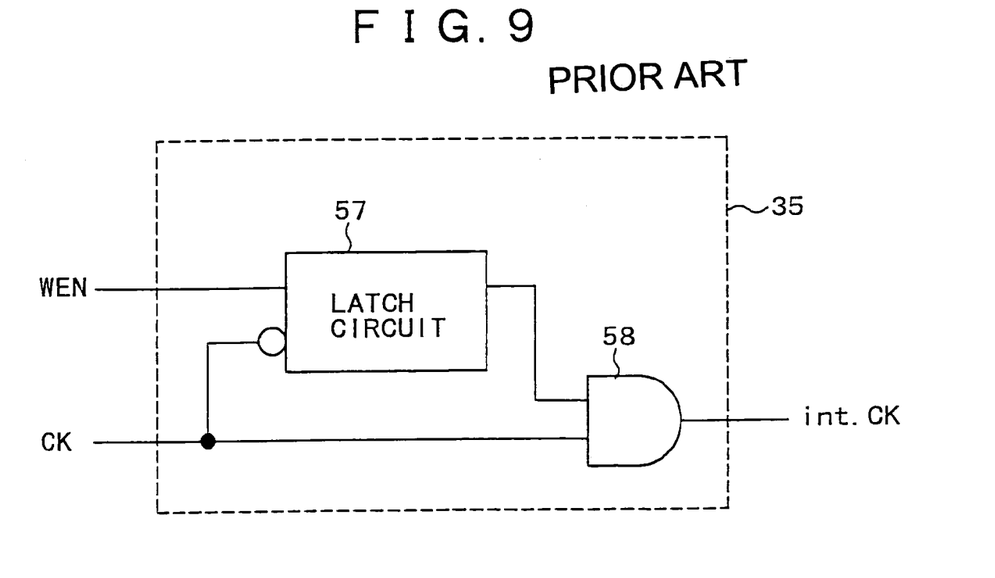
FIG. 9 is a diagram showing a configuration of a gated clock circuit shown in FIG. 8.

FIG. 9 is a diagram showing a configuration of the gated clock circuit 35 shown in FIG. 8. It is to be noted that the gated clock circuits 31 to 34 and 36 shown in FIG. 8 have a similar configuration to that of the gated clock circuit 35 shown in FIG. 9.

As shown in FIG. 9, the gated clock circuit 35 includes a latch circuit 57 and an AND circuit 58. The latch circuit 57 is supplied with the write enable signal WEN and an inverted signal of the clock signal CK. The AND circuit 58 is supplied with an output signal of the latch circuit 57 and the clock signal CK. The AND circuit 58 generates and outputs an internal clock signal int.CK.

Specifically, the gated clock circuit 35 as described above outputs the clock signal CK as the internal clock signal int.CK only when the write enable signal WEN is 1 at the time of change of the inputted clock signal CK from 0 to 1. When the write enable signal WEN is 0 at the time of the change, the gated clock circuit 35 does not output a clock waveform and outputs a signal at a zero level.

Operation of the register file shown in FIG. 8 having the above-described configuration will be briefly described in the following. An operation of writing data to the latch type memory cells M1 to M8 will be described first.

At the time of data writing, the write enable signal WEN supplied to the gated clock circuit 35 is activated, whereby an internal clock signal int.CK is generated in response to the externally supplied clock signal CK. The internal clock signal int.CK is supplied to the gated clock circuits 31 to 34 and the flip-flops 43 and 45.

The decoder D1 receives a writing address WAD for specifying a memory cell to be written, and decodes the writing address WAD. The gated clock circuits 31 to 34 selectively activate selecting lines SL1 to SL4 according to a result of the decoding.

On the other hand, the flip-flops 43 and 45 supply an input signal Si supplied thereto to the latch type memory cells M1 to M8 in response to the internal clock signal int.CK supplied thereto. At this time, when the selecting line SL1 is activated, for example, the input signal Si is written to only the latch type memory cells M1 and M2 connected to the selecting line SL1.

An operation of reading data from the latch type memory cells M1 to M8 will be described next. At the time of data reading, the read enable signal REN supplied to the gated clock circuit 36 is activated, whereby an internal clock signal int.CK is generated in response to the externally supplied clock signal CK. The internal clock signal int.CK is supplied to the flip-flop 42.

The decoder D2 receives a reading address RAD for specifying a memory cell to be read via the flip-flop 42, decodes the reading address RAD, and then supplies a result of the decoding to the selectors 53 and 54. The selector 53 is supplied with data retained by the latch type memory cells M1, M3, M5, and M7, and the selector 54 is supplied with data retained by the latch type memory cells M2, M4, M6, and M8. According to the result of the decoding supplied to the selectors 53 and 54, the selectors 53 and 54 selectively output the data as an output signal So.

The register file as described above, however, has a disadvantage of difficulty in conducting a manufacturing test. Specifically, a scan path has come into wide use as a circuit for facilitating a manufacturing test on a chip including a logic circuit, but with the scan path, the manufacturing test is not conducted on latch circuits.

Conventionally, one of the following methods is taken to obviate the above disadvantage. First, there is a method that uses a BIST (Built In Self Test) circuit in wide use for a manufacturing test on a RAM. The method will be described with reference to FIG. 10.

Figure 10:
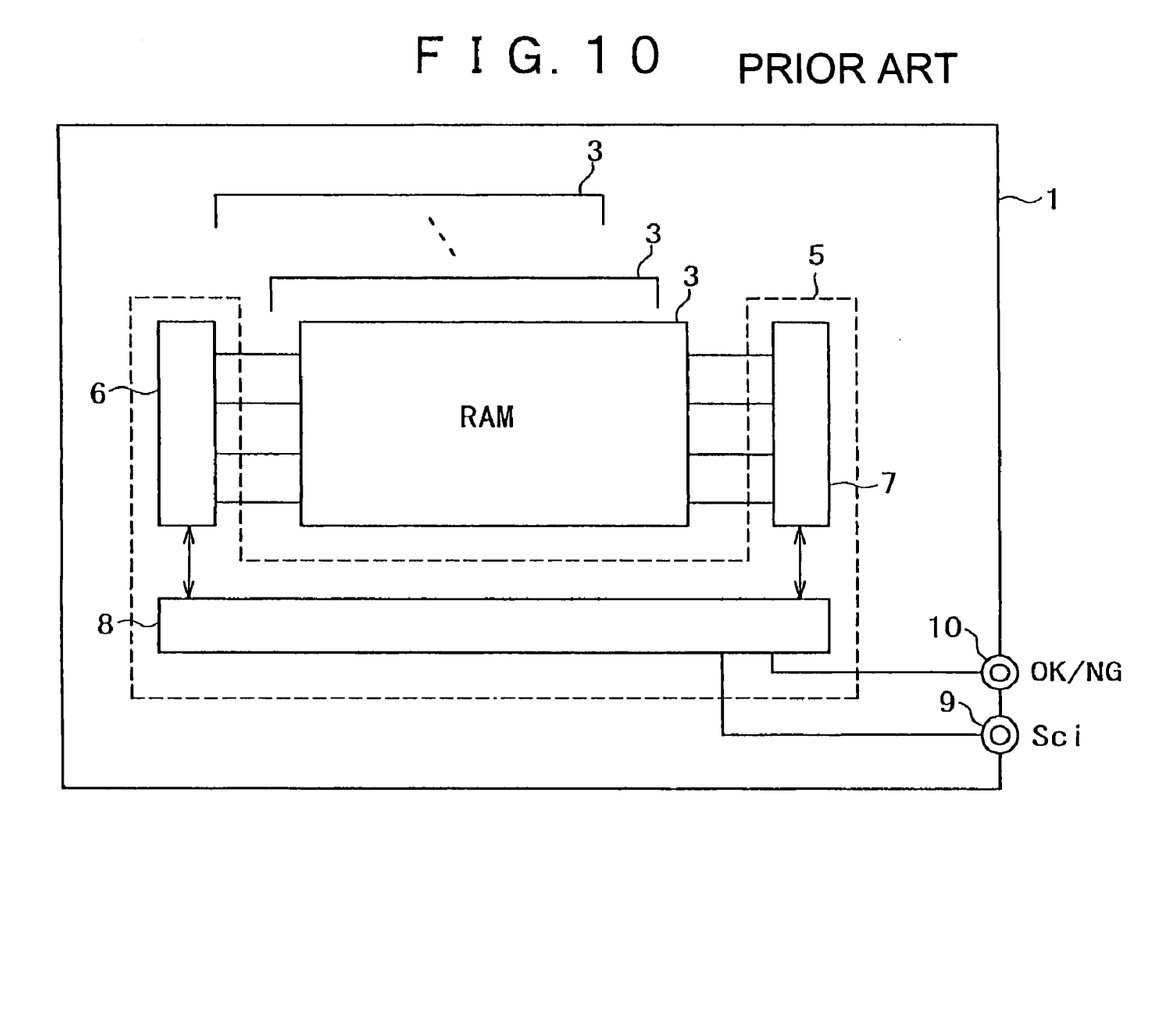
FIG. 10 is a diagram showing a configuration of a chip including a conventional memory BIST circuit for realizing a manufacturing test on a RAM.

FIG. 10 is a diagram showing a configuration of a chip 1 including a conventional BIST circuit 5 for realizing a manufacturing test on a RAM. As shown in FIG. 10, the chip 1 includes a RAM 3, a test data supply circuit 6, a test data output circuit 7, a test control circuit 8, a control signal input terminal 9, and a test result output terminal 10. The BIST circuit 5 is formed by the test data supply circuit 6, the test data output circuit 7, and the test control circuit 8.

In the BIST circuit 5, in response to a control signal Sci supplied to the test control circuit 8 via the control signal input terminal 9, the test control circuit 8 makes the test data supply circuit 6 internally generate a test signal and supply the test signal to the RAM 3. The test control circuit 8 receives an output signal from the RAM 3 via the test data output circuit 7, and then compares the output signal with an expected value. At this time, when the test control circuit 8 determines that the output signal of the RAM 3 coincides with the expected value, the test control circuit 8 outputs a signal OK indicating that the RAM 3 is normal to the outside via the test result output terminal 10. When the test control circuit 8 determines that the output signal of the RAM 3 does not coincide with the expected value, the test control circuit 8 outputs a signal NG indicating that the RAM 3 is faulty to the outside via the test result output terminal 10.

The chip 1 has a plurality of RAMs 3. The BIST circuit 5 as described above is provided in correspondence with each of the RAMs 3, and has a scale of a few hundred to a few thousand gates for one RAM 3.

Thus, there is a problem in employing the BIST circuit 5 on such a large scale in a register file on a small scale in that circuit area overhead is caused.

Figure 11:
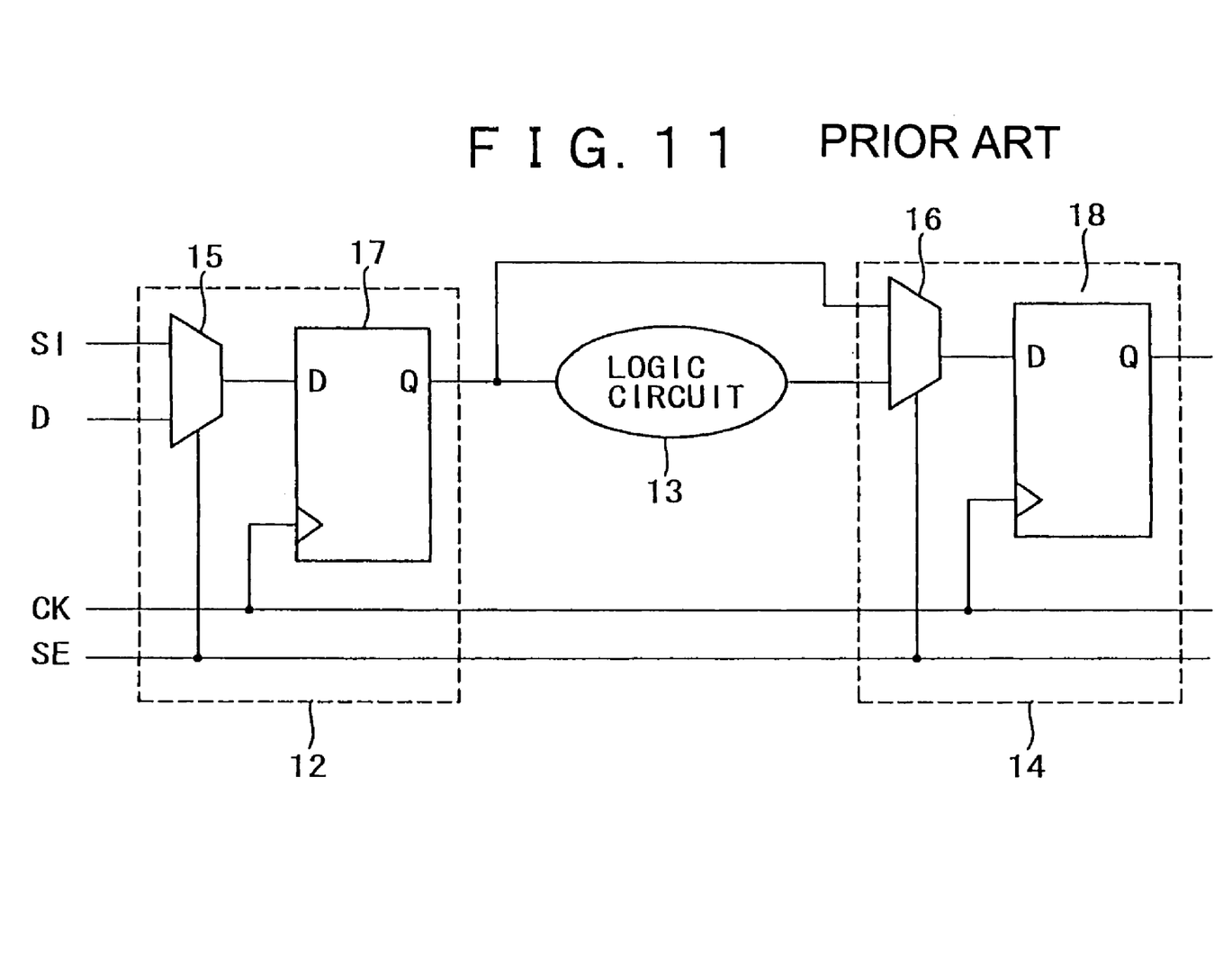
FIG. 11 is a circuit diagram explaining the configuration and operation of scan flip-flops.

Next, there is a method of replacing the latch type memory cells M1 to M8 with scan flip-flops. In the following, functions of scan flip-flops 12 and 14 will be described with reference to FIG. 11. As shown in FIG. 11, the scan flip-flop 12 includes a selector 15 and a flip-flop 17, and the scan flip-flop 14 includes a selector 16 and a flip-flop 18. The scan flip-flop 12 and the scan flip-flop 14 are connected to an input node and an output node, respectively, of a logic circuit 13, for example.

The selectors 15 and 16 are supplied with a selection signal SE. Clock input nodes of the flip-flops 17 and 18 are supplied with a clock signal CK. Also, the selector 15 is supplied with data D and a scan-in signal SI, and the selector 16 is supplied with an output signal of the flip-flop 17 and an output signal of the logic circuit 13.

With the scan flip-flops 12 and 14 as shown in FIG. 11, a scan path that bypasses the logic circuit 13 can be formed by making the selector 15 selectively output the scan-in signal SI and making the selector 16 selectively output the output signal of the flip-flop 17.

By using the scan flip-flops 12 and 14 having the above function in place of the latch type memory cells M1 to M8, a manufacturing test can be conducted with the scan path formed as described above. However, the scan flip-flops 12 and 14 have a circuit area about three times that of the latch type memory cells M1 to M8, thus presenting a problem of an increase in the scale of the circuit as a whole.

In addition, the scan flip-flops 12 and 14 consume about twice as much power as the latch type memory cells M1 to M8. The scan flip-flops 12 and 14, therefore, have another problem in that the reduction in power consumption as compared with RAM is halved.

Figure 12:
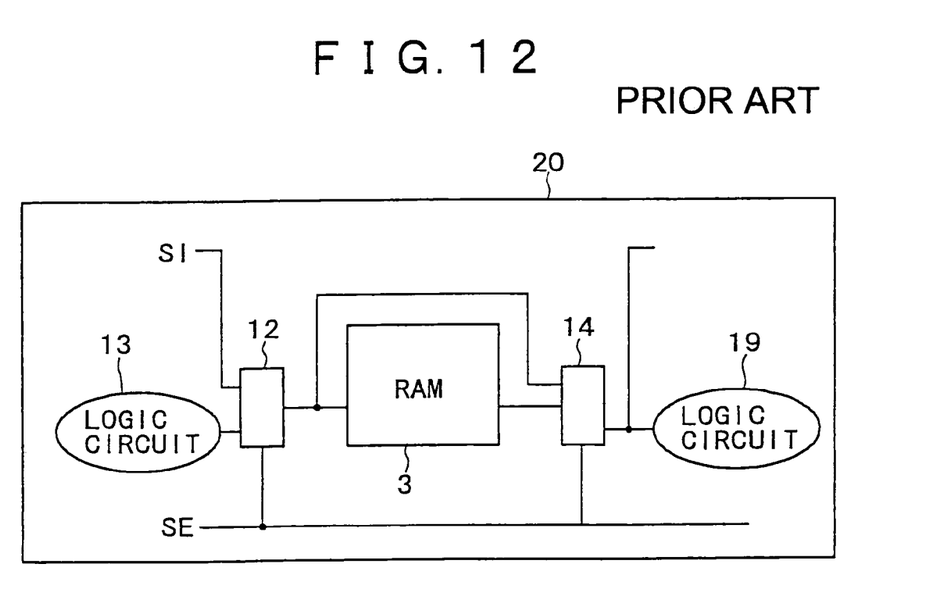
FIG. 12 is a diagram explaining a conventional method of testing a RAM using the scan flip-flops shown in FIG. 11.

On the other hand, in conducting a manufacturing test using a scan path, there is another problem of difficulty in testing logic circuits connected to an input side and an output side of a memory. Conventionally, to deal with such a problem, scan flip-flops 12 and 14 are provided between a RAM 3 and logic circuits 13 and 19, respectively, on a chip 20, and wiring that bypasses the RAM 3 is formed from an output node of the scan flip-flop 12, whereby the logic circuits 13 and 19 are tested as shown in FIG. 12, for example.

Specifically, the scan flip-flop 14 is made to selectively output an output signal of the scan flip-flop 12 by a selection signal SE, whereby a scan path that bypasses only the RAM 3 can be formed. It is thus possible to realize a test on the logic circuits 13 and 19 without regard for the effects of the RAM 3.

However, the scan flip-flops 12 and 14 formed on the chip 20 cause problems such as an increase in the circuit scale of the chip 20 as a whole and a decrease in the operating speed of the circuit formed on the chip 20.

SUMMARY OF THE INVENTION

The present invention has been made to solve the above problems, and it is accordingly an object of the present invention to provide a semiconductor memory device having latch circuits as memory elements and a method of testing the semiconductor memory device that enable a manufacturing test to be conducted readily and reliably by a simple configuration and method.

The object of the present invention is achieved by providing a semiconductor memory device including: a plurality of memory cells each formed by latch means for latching data; initializing means for writing identical data to all of the memory cells in response to a simultaneous writing signal supplied thereto; and negative feedback means for inverting data outputted from the memory cell and selectively writing the inverted data to the memory cell.

With such means, it is possible to write only to a selected memory cell data different from data stored in the other memory cells by the negative feedback means.

The semiconductor memory device further includes a plurality of data retaining means for forming a scan path and inputting and outputting data to and from the memory cells via the scan path. It is therefore possible to readily input desired data to the memory cells using the scan path and readily output data read from the memory cells to the outside via the scan path.

The above means are similarly applicable to a so-called multiport type semiconductor memory device further including input data selecting means for selectively writing a plurality of pieces of input data supplied thereto to the memory cells.

Further, the object of the present invention is achieved by providing a method of testing a semiconductor memory device, the semiconductor memory device including a plurality of memory cells, the method including: a first step for writing identical data to all of the memory cells; a second step for inverting data outputted from the memory cell and selectively writing the inverted data to the memory cell; and a third step for reading data stored in all of the memory cells and comparing the data with an expected value.

With such means, it is possible to write only to a selected memory cell data different from the data stored in the other memory cells, and thereby test a function of reading and writing data from and to the memory cells of the semiconductor memory device readily and reliably.

The above and other objects, features and advantages of the present invention will become apparent from the following description and the appended claims, taken in conjunction with the accompanying drawings in which like parts or elements are denoted by like reference symbols.

DETAILED DESCRIPTION OF THE PREFERRED EMBODIMENTS

Preferred embodiments of the present invention will hereinafter be described in detail with reference to the drawings. The same reference numerals in the figures denote the same or corresponding parts.

First Embodiment

Figure 1:
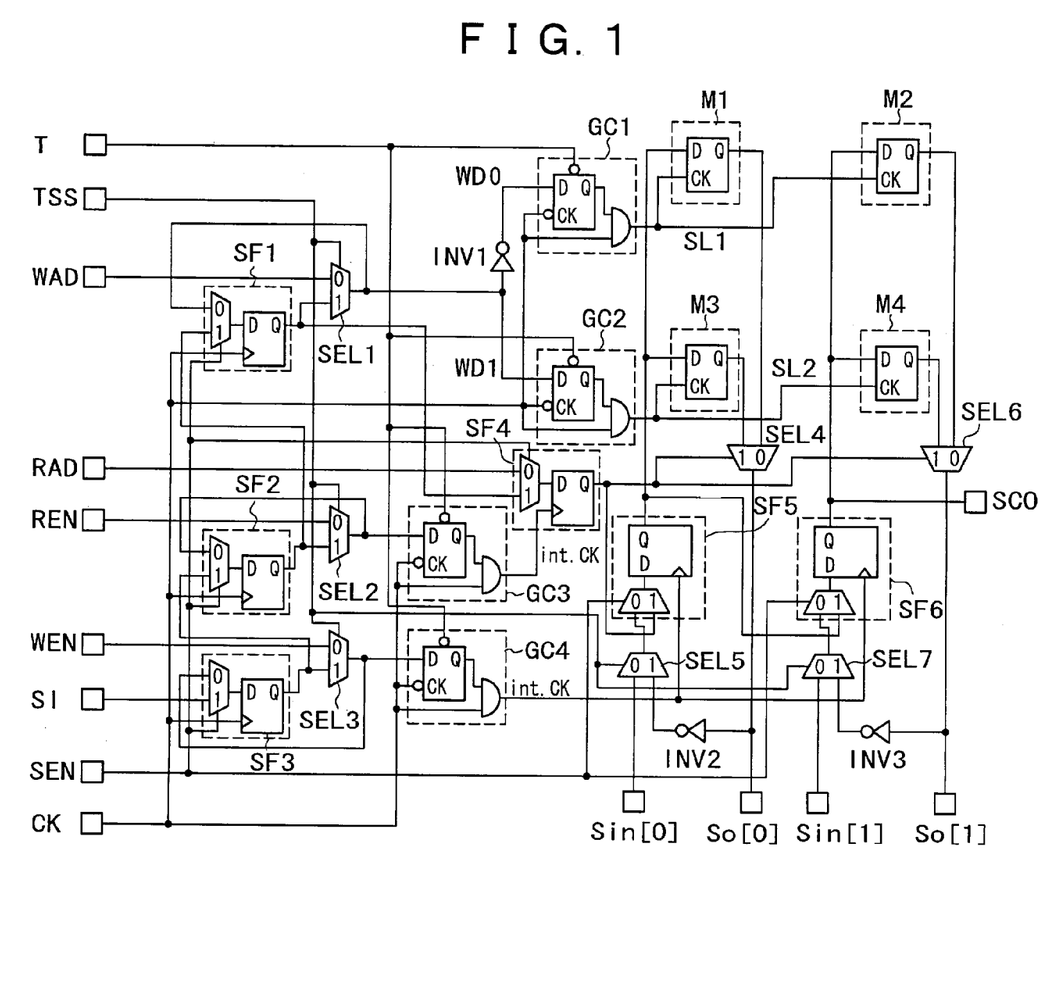
FIG. 1 is a circuit diagram showing a configuration of a register file according to a first embodiment of the present invention.

FIG. 1 is a circuit diagram showing a configuration of a register file according to a first embodiment of the present invention. It is to be noted that while a register file with a 2-word by 2-bit configuration is shown in FIG. 1 for convenience of description, a register file with an m-word by n-bit configuration (both m and n are a natural number) may be considered in a similar manner.

A combination of a latch type memory cell M1 and a latch type memory cell M2 or a combination of a latch type memory cell M3 and a latch type memory cell M4 shown in FIG. 1 forms "one word." Hence, the register file shown in FIG. 1 has a total of two words. In the register file shown in FIG. 1, input signals Sin[0] and Sin[1] and output signals So[0] and So[1] are each 2 bits. Thus, the register file shown in FIG. 1 is referred to as a register file with a 2-word by 2-bit configuration, as described above.

Since the register file shown in FIG. 1 is of the 2-word configuration, a circuit corresponding to the decoders D1 and D2 shown in FIG. 8 is simplified; a signal WD0 and a signal WD1 correspond to the output signal of the decoder D1, and an output signal of a scan flip-flop SF4, to be described later, corresponds to the output signal of the decoder D2.

As shown in FIG. 1, the register file according to the first embodiment of the present invention includes: the abovementioned latch type memory cells M1 to M4; scan flip-flops SF1 to SF6; gated clock circuits GC1 to GC4; selectors SEL1 to SEL7; and inverting circuits INV1 to INV3.

A scan enable signal SEN is supplied to selectors included in the scan flip-flops SF1 to SF6, and a scan-in signal SI is supplied to a selector included in the scan flip-flop SF3. The selector included in the scan flip-flop SF2 is connected to an output node of the scan flip-flop SF3, and the selector included in the scan flip-flop SF1 is connected to an output node of the scan flip-flop SF2.

The selector SEL3 is supplied with a write enable signal WEN and an output signal of the scan flip-flop SF3; the selector SEL2 is supplied with a read enable signal REN and an output signal of the scan flip-flop SF2; and the selector SEL1 is supplied with a writing address WAD and an output signal of the scan flip-flop SF1. The selectors SEL1 to SEL3 selectively output the signals supplied thereto according to a feedback control signal TSS.

The selector included in the scan flip-flop SF4 is supplied with the output signal of the scan flip-flop SF1 and a reading address RAD.

The gated clock circuit GC1 is connected to the selector SEL1 via the inverting circuit INV1; and the gated clock circuit GC2 is connected to the selector SEL1. Similarly, the gated clock circuit GC3 is connected to the selector SEL2; and the gated clock circuit GC4 is connected to the selector SEL3.

An output node of the gated clock circuit GC1 is connected to clock input nodes of the latch type memory cells M1 and M2; an output node of the gated clock circuit GC2 is connected to clock input nodes of the latch type memory cells M3 and M4; an output node of the gated clock circuit GC3 is connected to a clock input node of the scan flip-flop SF4; and an output node of the gated clock circuit GC4 is connected to clock input nodes of the scan flip-flops SF5 and SF6.

Data input nodes of the latch type memory cells M1 and M3 are both connected to an output node of the scan flip-flop SF5. The selector included in the scan flip-flop SF5 is supplied with an output signal of the selector SEL5 and an output signal of the scan flip-flop SF4. The selector SEL5 is supplied with an input signal Sin[0] and an inverted signal of an output signal of the selector SEL4, and selectively presents an output according to the feedback control signal TSS.

Similarly, data input nodes of the latch type memory cells M2 and M4 are both connected to an output node of the scan flip-flop SF6. The selector included in the scan flip-flop SF6 is supplied with an output signal of the selector SEL7 and an output signal of the scan flip-flop SF5. The selector SEL7 is supplied with an input signal Sin[1] and an inverted signal of an output signal of the selector SEL6, and selectively presents an output according to the feedback control signal TSS.

The selector SEL4 is connected to output nodes of the latch type memory cells M1 and M3, and selectively outputs an output signal So[0] according to the output signal of the scan flip-flop SF4. Similarly, the selector SEL6 is connected to output nodes of the latch type memory cells M2 and M4, and selectively outputs an output signal So[1] according to the output signal of the scan flip-flop SF4.

Clock input nodes of the scan flip-flops SF1 to SF3 and the gated clock circuits GC1 to GC4 are supplied with a clock signal CK. Preset nodes of the gated clock circuits GC1 to GC4 are supplied with a simultaneous writing signal T. The scan flip-flop SF6 outputs a scan output signal SCO.

Normal operation of the register file having such a configuration will next be described. In the following, an operation of writing data to the latch type memory cells M1 to M4 will first be described.

At the time of data writing, the write enable signal WEN supplied to the gated clock circuit GC4 via the selector SEL3 is activated, whereby an internal clock signal int.CK is generated in response to the externally supplied clock signal CK. The internal clock signal int.CK is supplied to the scan flip-flops SF5 and SF6.

The gated clock circuits GC1 and GC2 receive a writing address WAD for specifying a memory cell to be written via the selector SEL1 and selectively activate selecting lines SL1 and SL2.

On the other hand, the scan flip-flops SF5 and SF6 supply the input signals Sin[0] and Sin[1] supplied thereto to the latch type memory cells M1 to M4 in response to the internal clock signal int.CK supplied thereto. At this time, when the selecting line SL1 is activated, for example, the input signals Sin[0] and Sin[1] are written to the latch type memory cells M1 and M2, respectively, which are connected to the selecting line SL1.

An operation of reading data from the latch type memory cells M1 to M4 will be described next. At the time of data reading, the read enable signal REN supplied to the gated clock circuit GC3 via the selector SEL2 is activated, whereby an internal clock signal int.CK is generated in response to the externally supplied clock signal CK. The internal clock signal int.CK is supplied to the scan flip-flop SF4.

The scan flip-flop SF4 receives a reading address RAD for specifying a memory cell to be read and then supplies a signal to the selectors SEL4 and SEL6. The selector SEL4 is supplied with data retained by the latch type memory cells M1 and M3, and the selector SEL6 is supplied with data retained by the latch type memory cells M2 and M4. According to the signal supplied from the scan flip-flop SF4, the selectors SEL4 and SEL6 selectively output the data as output signals So[0] and So[1].

An outline of a method of testing the register file for correct decoding of the writing and reading addresses WAD and RAD will be described next with reference to the flowchart of FIG. 2.

Figure 2:
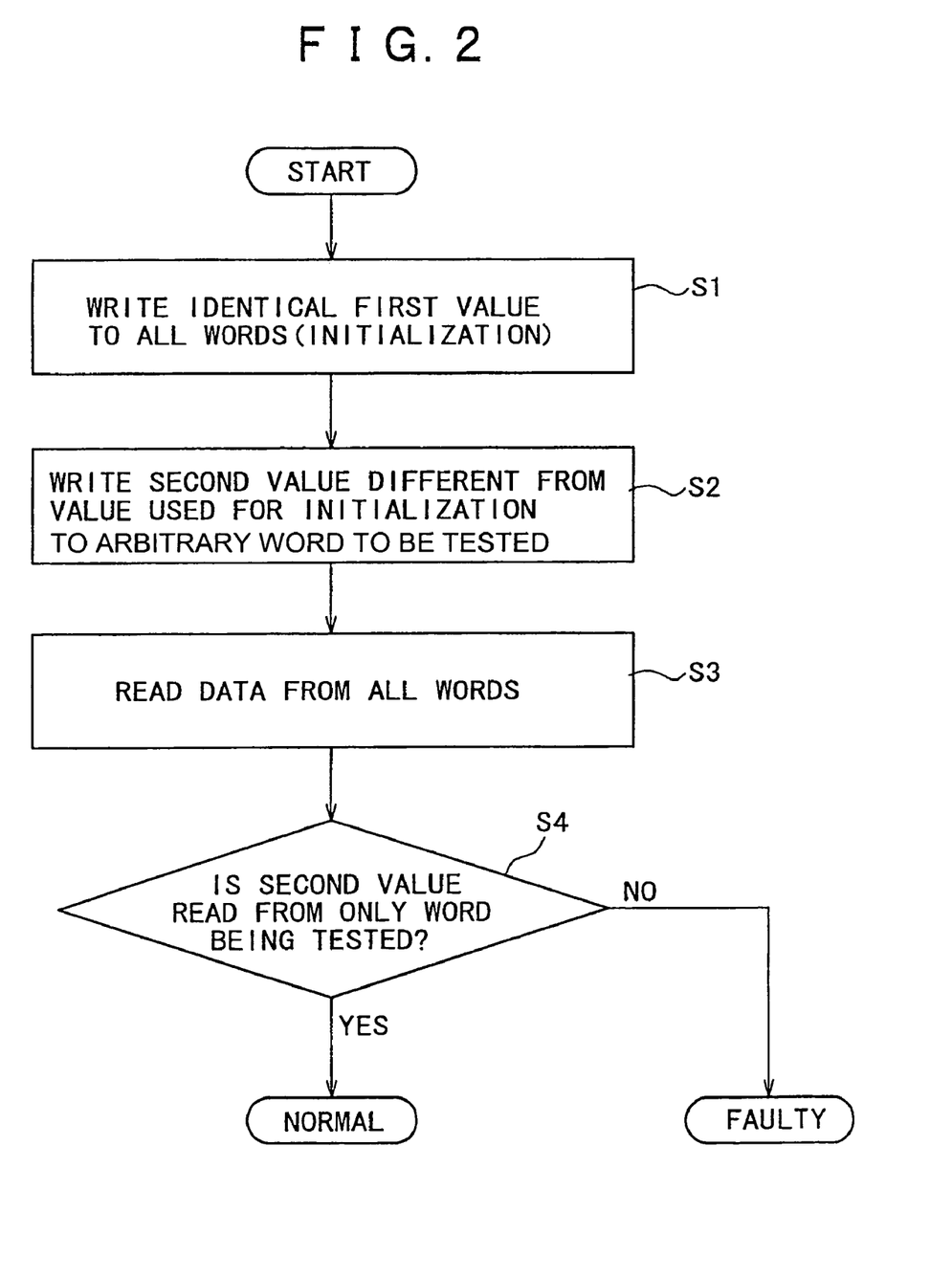
FIG. 2 is a flowchart of an outline of a method of testing an address decoder in the register file shown in FIG. 1.

As shown in FIG. 2, at step S1, an identical first value, for example "0" data is written to all the words, that is, all the latch type memory cells M1 to M4 for initialization.

At step S2, a second value different from the value used for initialization, for example, "1" data, is written to an arbitrary word to be tested, for example, the latch type memory cells M1 and M2.

Next, at step S3, data is read from all the words. The data reading is performed for each word. Hence, the operation from the step S1 to the data reading is repeated for each of all the words.

At step S4, whether or not the second value, that is, the "1" data in the above example is read from only the word being tested, that is, the latch type memory cells M1 and M2 in the above example is determined.

Consequently, when the "1" data is read from only the latch type memory cells M1 and M2 in the above example, it means that the writing and reading addresses WAD and RAD are decoded correctly for the word formed by the latch type memory cells M1 and M2. In other cases, for example, when the "1" data is not read from the latch type memory cells M1 and M2 or when the "1" data is read also from the latch type memory cells M3 and M4, the decoding is not performed correctly. The register file is thus faulty.

Thus, by sequentially changing the word to which the second value is written to each of the words and determining whether or not the decoding is performed correctly for each of the words, it is possible to test the register file for faults.

The initialization at step S1 will be described in the following in detail with reference to FIG. 3, which shows an initializing circuit. It is to be noted that in FIG. 3, for simplicity of the figure, the selectors included in the scan flip-flops SF5 and SF6 are not shown, and, for convenience, latch type memory cells M1 to M(k+1) are denoted by the reference numerals in order of increasing distance from the scan flip-flops SF5 and SF6.

Although the simultaneous writing signal T supplied to the preset nodes PST of gated clock circuits GC1 to GCn has a logical value of 1 during normal operation of the register file, it has a logical value of 0 when the initialization is performed.

Thereby all the gated clock circuits GC1 to GCn output a clock signal CK, so that the clock signal CK is supplied to the clock input nodes of all the latch type memory cells M1 to M(k+1). Thereby, a signal outputted from the scan flip-flop SF5 is written to the latch type memory cells M1, M3, M(k), and a signal outputted from the scan flip-flop SF6 is written to the latch type memory cells M2, M4, M(k+1).

Since the scan-in signal SI can be inputted to the scan flip-flop SF5 via the scan flip-flop SF4 and to the scan flip-flop SF6 via the scan flip-flop SF5, an arbitrary value can be externally set directly to all the latch type memory cells M1 to M(k+1) by using the scan path.

That is, for example, by setting the scan-in signal SI to be data of 0 and storing the data of 0 in the scan flip-flops SF5 and SF6 via the scan path, and by setting the simultaneous writing signal T to 0, the data of 0 can be written to all the latch type memory cells M1 to M(k+1) simultaneously, that is, in a single operation. Thus, the initialization can be performed at high speed.

On the other hand, since the scan flip-flops SF5 and SF6 are provided to input data to the latch type memory cells M1 to M(k+1), a logic circuit on the input side of the latch type memory cells M1 to M(k+1) can be tested using the scan path.

Specifically, since the scan path is formed by a path sequentially connecting the scan flip-flop SF3, the scan flip-flop SF2, the scan flip-flop SF1, the scan flip-flop SF4, the scan flip-flop SF5, and the scan flip-Substitute flop SF6, an output signal of the logic circuit on the input side disposed between the scan flip-flops SF1 to SF4 and the like can be outputted to the outside as a scan output signal SCO. Thus, the logic circuit can be readily tested.

Also, a logic circuit on the output side of the latch type memory cells M1 to M(k+1) can be tested by setting the same arbitrary value to (initializing) all the latch type memory cells M1 to M(k+1) via the scan path, as described above.

Specifically, after the initialization described above is performed, the same value is outputted from the latch type memory cells M1 to M(k+1) for whatever reading address RAD is selected. Hence, the logic circuit on the output side can be readily tested with an arbitrary value by supplying the value to the logic circuit on the output side and observing the output of the logic circuit in response to the value.

The operation shown at step S2 in FIG. 2 of writing a second value different from the value used for initialization to an arbitrary word to be tested will be described next in detail with reference to FIG. 4, in which a circuit related to the operation is extracted. It is to be noted that also in FIG. 4, for simplicity of the figure, the selectors included in the scan flip-flops SF5 and SF6 are not shown, and, for convenience, latch type memory cells M1 to M(k+1) are denoted by the reference numerals in order of increasing distance from the scan flip-flops SF5 and SF6.

Figure 4:
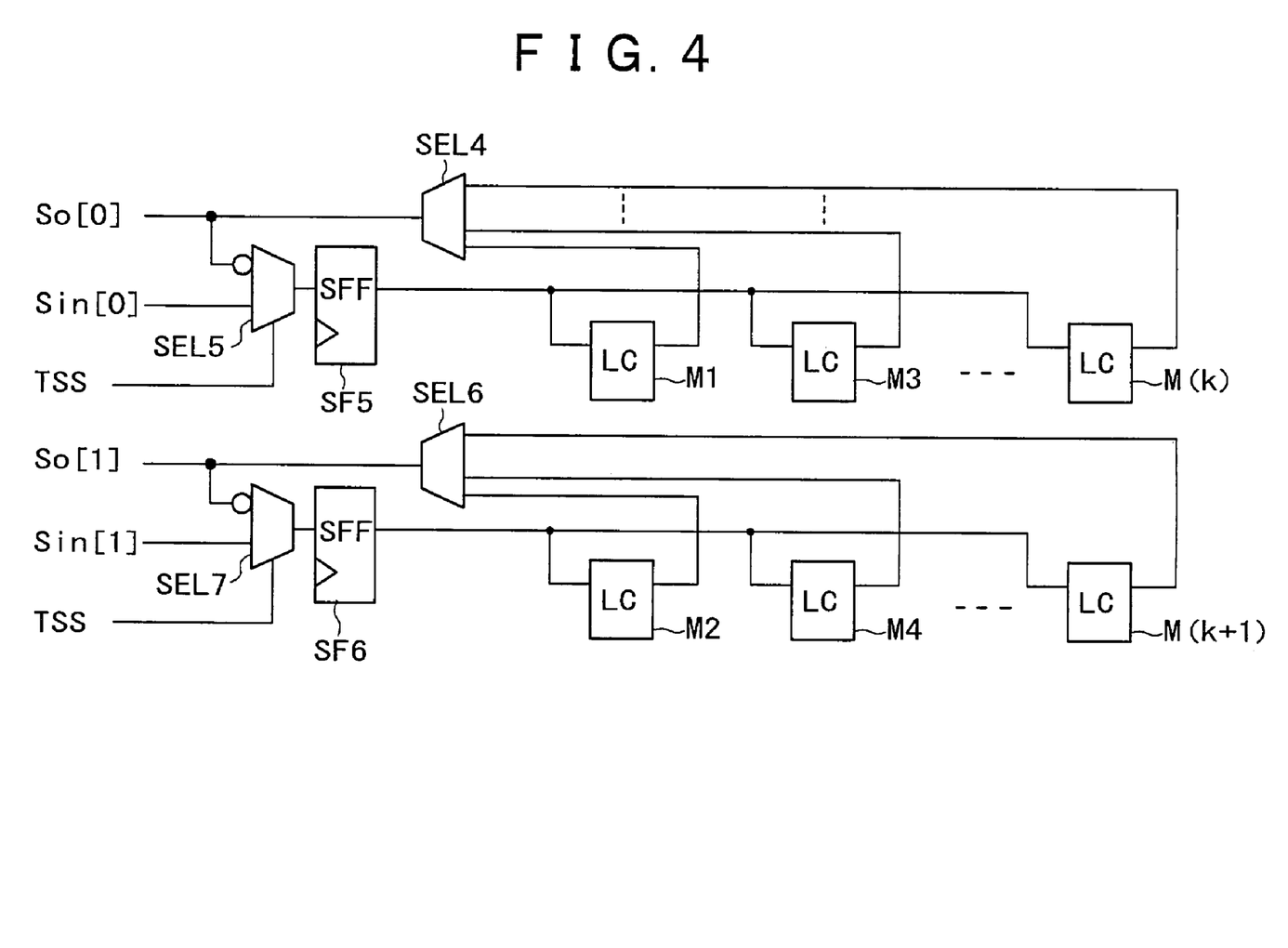
FIG. 4 is a circuit diagram showing a circuit for writing a value different from a value used for initialization to an arbitrary word in the register file shown in FIG. 1.

As shown in FIG. 4, output signals of the latch type memory cells M1, M3, M(k) are all supplied to the selector SEL4, and output signals of the latch type memory cells M2, M4, M(k+1) are all supplied to the selector SEL6. Signals selected by the selectors SEL4 and SEL6 are outputted as output signals So[0] and So[1], respectively.

At this time, the signal selected by the selector SEL4 is inverted by the inverting circuit INV2 and then supplied to the selector SEL5; and the signal selected by the selector SEL6 is inverted by the inverting circuit INV3 and then supplied to the selector SEL7. That is, the output signal So[0] and the output signal So[1] undergo negative feedback to the selectors SEL5 and SEL7.

The feedback control signal TSS supplied to the selectors SEL5 and SEL7 is at a zero level during normal operation. The selectors SEL5 and SEL7 selectively output the input signals Sin[0] and Sin[1], respectively, according to the feedback control signal TSS at the zero level. Thus, during normal operation, the input signals Sin[0] and Sin[1] are written to the latch type memory cells M1 to M(k+1).

The feedback control signal TSS is at a high level during test operation. According to the feedback control signal TSS at the high level, the selectors SEL5 and SEL7 supply inverted signals of the signals outputted from the selectors SEL4 and SEL6 to the scan flip-flops SF5 and SF6, respectively. Thus, during test operation, the inverted signals are supplied to the latch type memory cells M1 to M(k+1), and thereby the inverted signals are written to memory cells specified by a writing address WAD.

As described above, the circuit shown in FIG. 4 enables inverted data of an initial value to be written to a selected word by a simple configuration and method. It is therefore possible to realize a high-speed test on the register file without increasing the scale of the circuit.

In the following, the operation of the register file shown in FIG. 1 will be described with reference to the timing charts of FIGS. 5A, 5B, 5C, and 5D. In this case, as shown in FIG. 5B, the simultaneous writing signal T is at a low level (zero level) in a period from a time T1 to a time T2.

Figure 5A:
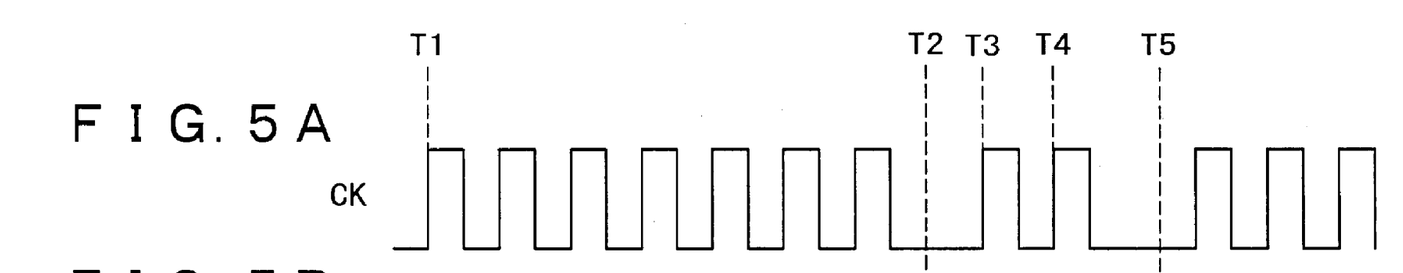
FIGS. 5A, 5B, 5C, and 5D are timing charts of an operation of the register file shown in FIG. 1.
Figure 5B:
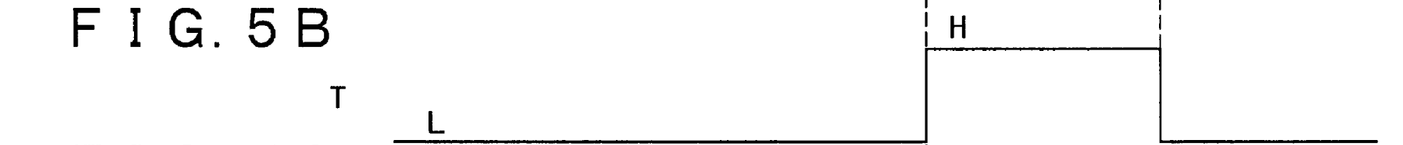

In this period, the above-described initialization is repeated in response to a clock signal CK shown in FIG. 5A. Therefore, the initialization is performed finally by a clock immediately before the simultaneous writing signal T is set to a high level (1 level) at the time T2.

Figure 5C:
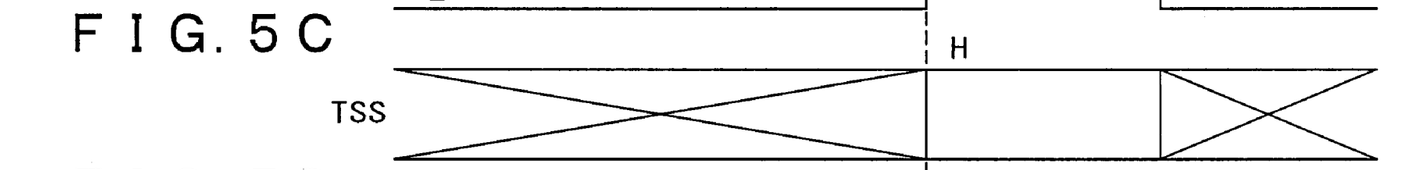
Figure 5D:
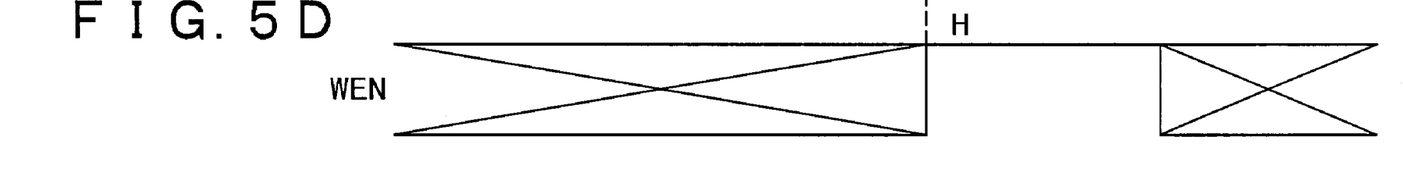

As shown in FIGS. 5C and 5D, when the feedback control signal TSS and the write enable signal WEN are changed to a high level at the time T2, an inverted signal of data written to the memory cells at the time of the initialization is written to a word specified by a writing address WAD by a clock immediately after the time T2, that is, a clock at a time T3, as shown in FIG. 5A.

Then, data is read from a word specified by a reading address RAD by a clock immediately after the time T3, that is, a clock at a time T4, as shown in FIG. 5A. In this case, an inverted signal of the read data is stored in the scan flip-flops SF5 and SF6, and can therefore be outputted to the outside as a scan output signal SCO through the scan path.

The series of operations of initialization, writing, and reading as described above is repeated while fixing the word to be written and sequentially changing the word to be read. After all the words are read, the word to be written is sequentially changed to each of the words and the operations are repeated. At this time, an external tester determines whether or not the scan output signal SCO coincides with a predetermined expected value for each word. It is consequently possible to determine whether or not the decoder, that is, the chip, is faulty or not.

As described above, with the register file according to the first embodiment of the present invention, a function of reading and writing data from and to the memory cells M1 to M(k+1) in the semiconductor memory device having the latch type memory cells M1 to M(k+1) as memory elements can be tested readily and reliably by a simple configuration and method.

Second Embodiment

The register file according to the first embodiment is a so-called "one-port memory" in which one port for inputting data or outputting data is provided for each of the latch type memory cells M1 to M(k+1). However, the present invention is applicable to a register file having a plurality of such ports.

Figure 6:
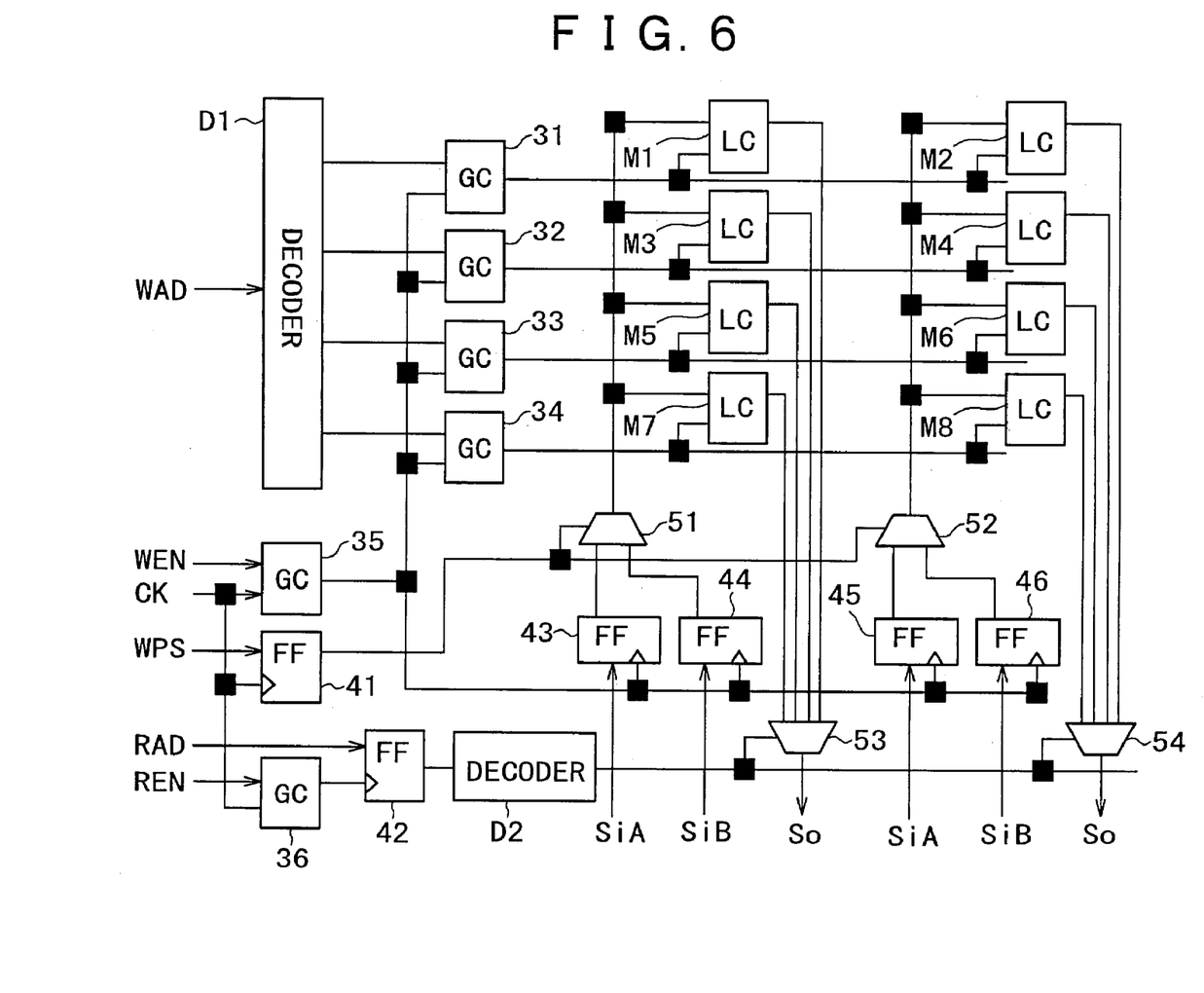
FIG. 6 is a block diagram showing a configuration of a common two-port type register file.

In the following, a description will be made of an application of the present invention to a type of register file that has two input ports and one output port for each of latch type memory cells M1 to M(k+1), as shown in FIG. 6, for example.

While the register file shown in FIG. 6 has a similar configuration to that of the register file shown in FIG. 8, the register file shown in FIG. 6 further includes flip-flops 41, 44, and 46 and selectors 51 and 52.

The selectors 51 and 52 are connected to the flip-flop 41. The selector 51 is connected to a flip-flop 43 and the flip-flop 44. The selector 52 is connected to a flip-flop 45 and the flip-flop 46.

The flip-flops 43 and 45 are supplied with an input signal SiA. The flip-flops 44 and 46 are supplied with an input signal SiB. The flip-flop 41 is supplied with a clock signal CK and a writing port selecting signal WPS.

The register file having the configuration described above operates in a similar manner to that of the register file shown in FIG. 8. However, according to the writing port selecting signal WPS supplied to the flip-flop 41, the selector 51 selectively supplies signals supplied thereto from the flip-flop 43 and the flip-flop 44 to latch type memory cells M1, M3, MS, and M7. Similarly, according to the writing port selecting signal WPS supplied to the flip-flop 41, the selector 52 selectively supplies signals supplied thereto from the flip-flop 45 and the flip-flop 46 to latch type memory cells M2, M4, M6, and M8.

Figure 7:
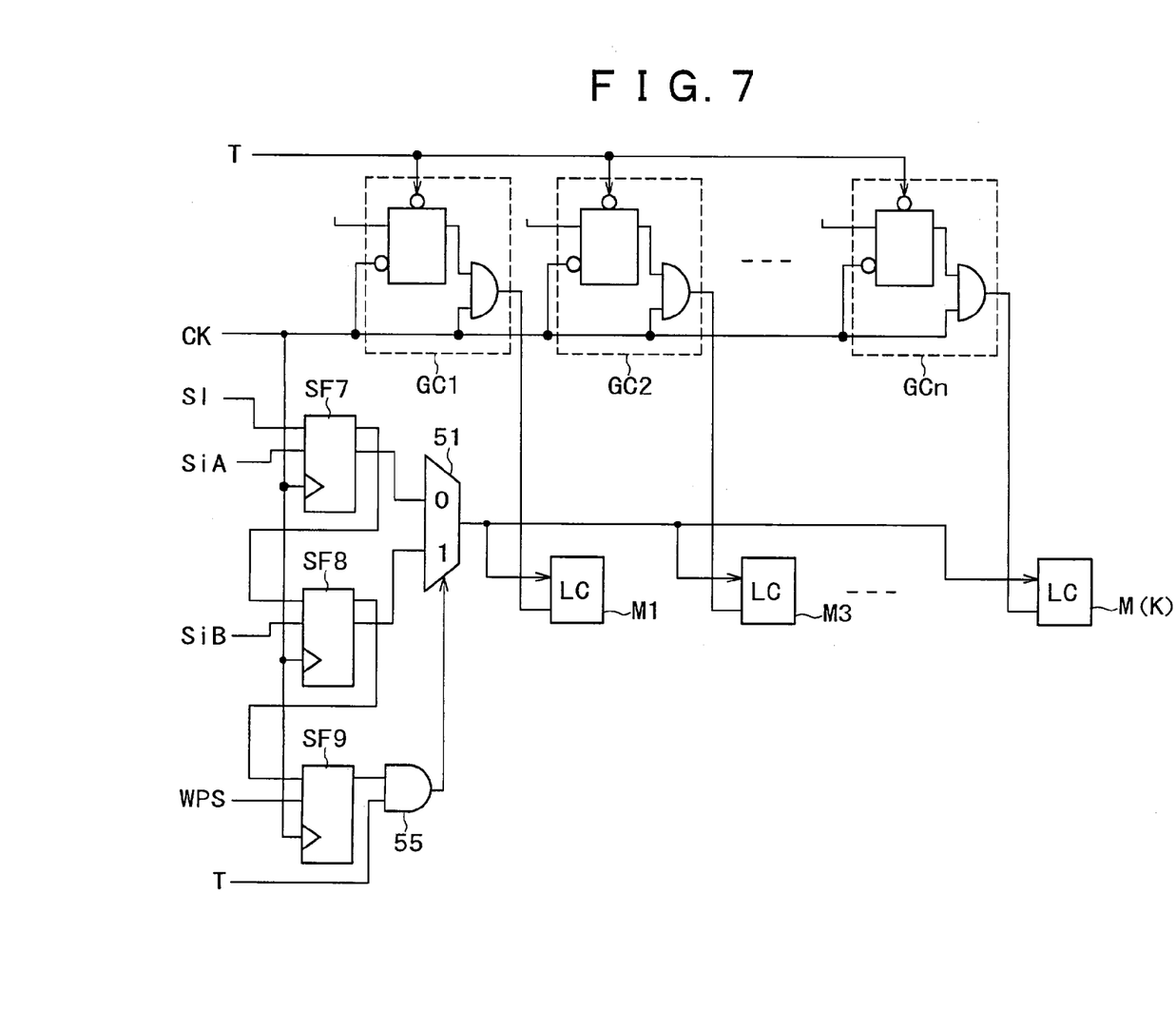
FIG. 7 is a circuit diagram showing an initializing circuit in a register file according to a second embodiment of the present invention.

FIG. 7 is a circuit diagram showing an initializing circuit in a case where the present invention is applied to the register file shown in FIG. 6. It is to be noted that in FIG. 7, for simplicity of the figure, selectors included in scan flip-flops SF7 to SF9 are not shown, and, for convenience, latch type memory cells M1 to M(k) are denoted by the reference numerals in order of increasing distance from the scan flip-flops SF7 and SF8.

Figure 3:
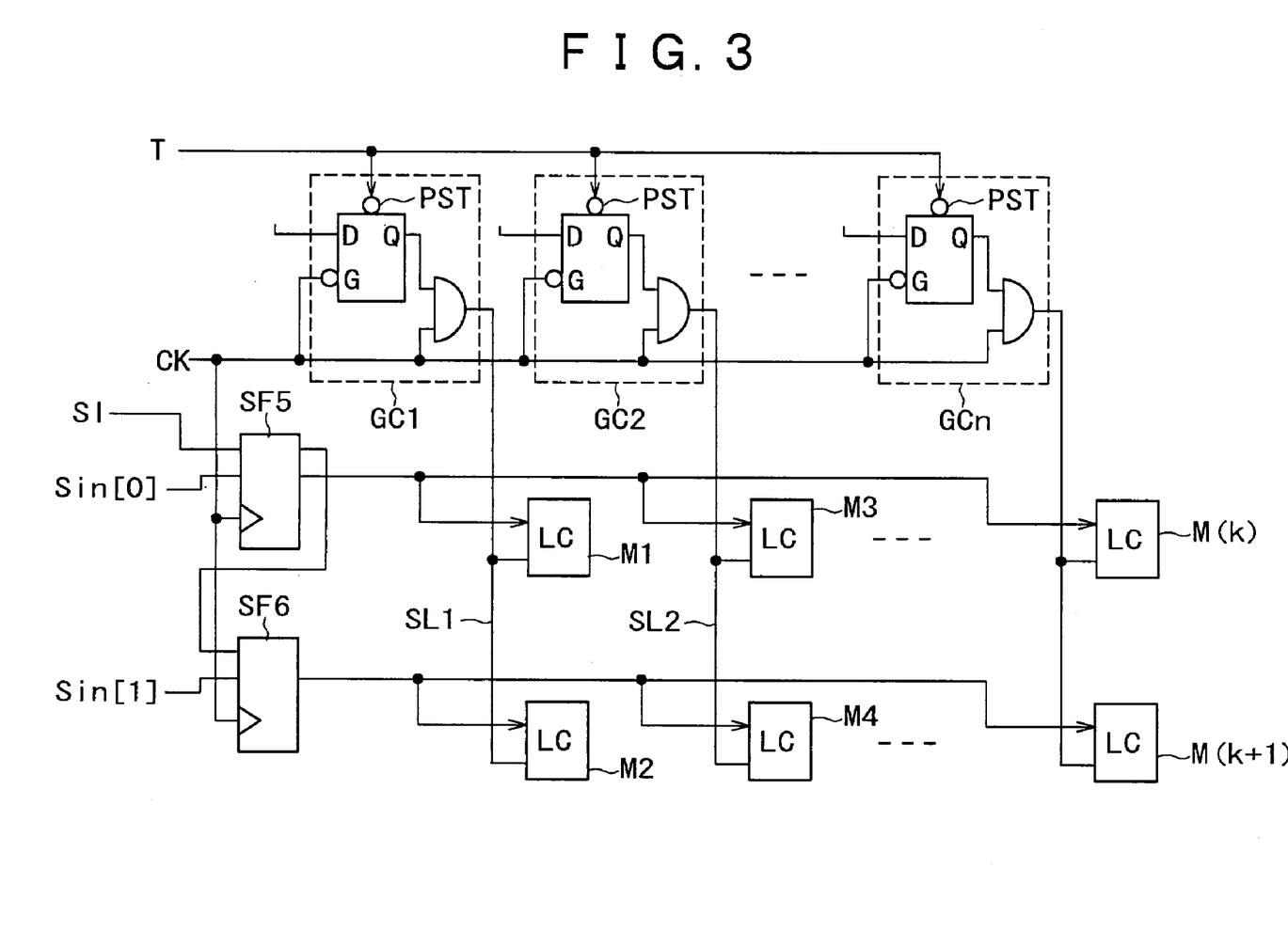
FIG. 3 is a circuit diagram showing an initializing circuit for performing an initialization operation shown in FIG. 2 in the register file shown in FIG. 1.

While the initializing circuit shown in FIG. 7 has a similar configuration to that of the initializing circuit shown in FIG. 3, the initializing circuit shown in FIG. 7 is different from the initializing circuit shown in FIG. 3 in that the initializing circuit shown in FIG. 7 further includes the scan flip-flop SF9 supplied with the writing port selecting signal WPS, an AND circuit 55, and the selector 51.

One input node of the AND circuit 55 is connected to an output node of the scan flip-flop SF9, and another input node of the AND circuit 55 is supplied with a simultaneous writing signal T. An output node of the AND circuit 55 is connected to the selector 51.

Generally, with a register file as shown in FIG. 6 having a plurality of input ports, it is difficult to create a test pattern, because when initialization as described above is performed, a value initially set to the latch type memory cells M1 to M(k+1) varies depending on the selection at the selectors 51 and 52.

However, with the initializing circuit shown in FIG. 7, by setting the simultaneous writing signal T to zero, a clock signal CK is supplied from gated clock circuits GC1 to GCn to the latch type memory cells M1 to M(k+1) as described above, while an output signal of the AND circuit 55 is set to a zero level.

Hence, by supplying the signal at the zero level from the AND circuit 55 to the selector 51, it is possible to forcefully output a signal supplied from the scan flip-flop SF7. Thus, a value set as an initial value to the latch type memory cells M1, M3, M(k) can be determined uniquely.

As described above, in the initialization, a predetermined input signal can be written to the latch type memory cells. Therefore, even with the so-called multiport type register file according to the second embodiment of the present invention, it is possible to create a test pattern more easily and obtain similar effects to those of the register file according to the foregoing first embodiment.

With a semiconductor memory device and a method of testing the same according to the present invention, it is possible to write only to a selected memory cell data different from data stored in other memory cells by a simple configuration and method, and to test a function of reading and writing data from and to the memory cells readily and reliably.

While preferred embodiments of the present invention have been described using specific terms, such description is for illustrative purposes only, and it is to be understood that changes and variations may be made without departing from the spirit or scope of the following claims.

What is claimed is:

1. A semiconductor memory device comprising:
   a plurality of memory cells, each of which includes latch means for storing bit data which composes a word of a plurality of words;
   test target word selecting means for determining a memory cell as a test target memory cell which stores bit data of a test target word by selecting an arbitrary word of said plurality of words as said test target word;
   initializing means for initializing said plurality of memory cells by storing identical data to all of said plurality of memory cells in response to a simultaneous writing signal supplied;
   negative feedback means for storing inverted bit data into said test target memory cell, the inverted bit data being formed by inverting bit data outputted from said test target memory cell;
   reading means for reading all of said plurality of words; and
   comparator means for comparing expectation values and all of said read words, wherein
   said test target word selecting means includes a test target word changing means for changing said test target word to another word;
   wherein after said storing said inverted bit data, only said test target memory cell contains said inverted bit data and all of said plurality of memory cells other than said test target memory cell contain said identical data; and
   wherein said initializing said plurality of memory cells, said storing inverted bit data, said reading all of said plurality of words and said comparing said expectation values and said read words are repeated with each of said changing of said test target word to said another word,
   wherein said negative feedback means comprise data retaining means for retaining input bit data which is either bit data via a scan path or said inverted bit data, and for outputting said inputted bit data to said test target memory cell and said scan path, and
   further comprising input data selection means for selectively writing a plurality of pieces of input data supplied thereto to said memory cells.

2. The semiconductor memory device as claimed in claim 1, wherein said negative feedback means comprise a plurality of said data retaining means, the number of said data retaining means being the same as the number of bits of one word.

3. A method of testing a semiconductor memory device, said semiconductor memory device including a plurality of memory cells, each of said memory cells storing bit data which composes a word of a plurality of words, said method comprising steps of:
   determining a memory cell as a test target memory cell which stores bit data of a test target word by selecting an arbitrary word of said plurality of words as said test target word;
   initializing said plurality of memory cells by storing identical data to all of said plurality of memory cells;
   storing inverted bit data into said test target memory cell, the inverted bit data being formed by inverting bit data outputted from said test target memory cell;
   reading all of said plurality of words;
   comparing expectation values and all of said read words; and
   changing said test target word to another word, wherein
   after said storing said inverted bit data, only said test target memory cell contains said inverted bit data and all of said plurality of memory cells other than said test target memory cell contain said identical data; and
   said initializing step, storing inverted bit data step, reading all of said plurality of words step and said comparing step are repeated every time said test target word is changed to said another word, and further comprising input data selection means for selectively writing a plurality of pieces of input data supplied thereto to said memory cells.

* * * * *